(12) United States Patent
Oh et al.

(10) Patent No.: US 6,956,237 B2
(45) Date of Patent: Oct. 18, 2005

(54) THIN FILM TRANSISTOR ARRAY SUBSTRATE AND METHOD FOR MANUFACTURING THE SAME

(75) Inventors: Jae Young Oh, Uiwang-shi (KR); Seung Hee Nam, Suwon-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 8 days.

(21) Appl. No.: 10/462,692

(22) Filed: Jun. 17, 2003

(65) Prior Publication Data

US 2004/0124451 A1 Jul. 1, 2004

(30) Foreign Application Priority Data

Dec. 28, 2002 (KR) ................................. 10-2002-0085735
Apr. 21, 2003 (KR) ................................. 10-2003-0024982

(51) Int. Cl.⁷ ............................................. H01L 29/04
(52) U.S. Cl. .......................................... 257/72; 257/59
(58) Field of Search ..................................... 257/59, 72

(56) References Cited

U.S. PATENT DOCUMENTS 5,763,904 A * 6/1998 Nakajima et al. ............. 257/66
6,396,079 B1   5/2002 Hayashi et al.
6,713,825 B2 * 3/2004 Hwang ........................ 257/408
6,781,646 B2 * 8/2004 Kawachi et al. .............. 349/47

FOREIGN PATENT DOCUMENTS

JP          10504685 A        5/1998

OTHER PUBLICATIONS

Robert F. Pierret "Semiconductor Device Fundamentals." pp. 653–658.

* cited by examiner

Primary Examiner—Gene M. Munson
(74) Attorney, Agent, or Firm—McKenna Long & Aldridge LLP

(57) ABSTRACT

A thin film transistor array substrate and a method for manufacturing the same is disclosed, in which it is possible to prevent mobile ions contained in a substrate from penetrating into a semiconductor layer by the gettering effect or neutralization in case soda lime glass is used for the substrate. The method includes forming a buffer layer on a substrate; doping impurity ions in the buffer layer; and forming a pixel electrode and a thin film transistor including a semiconductor layer on the buffer layer.

18 Claims, 6 Drawing Sheets

THIN FILM TRANSISTOR ARRAY SUBSTRATE AND METHOD FOR MANUFACTURING THE SAME

This application claims the benefit of the Korean Application Nos. P2002-85735, filed on Dec. 28, 2002 and P2003-24982, filed on Apr. 21, 2003, which are hereby incorporated by reference for all purposes as if fully set forth herein.

BACKGROUND OF THE INVENTION

1. Field of the Invention

The present invention relates to a liquid crystal display (LCD) device, and more particularly, to a thin film transistor array substrate and a method for manufacturing the same, in which it is possible to prevent mobile ions contained in a substrate from penetrating into a semiconductor layer by the gettering effect or neutralization in case the substrate is formed of Low End Glass.

2. Discussion of the Related Art

With the development of an information society, demands for various display devices increase. Accordingly, many efforts have been made to research and develop various flat display devices such as liquid crystal displays (LCD), plasma display panels (PDP), electroluminescent displays (ELD), and vacuum fluorescent displays (VFD). Some types of the flat display devices are already in use in displays of various types of equipment.

Among the various flat display devices, the liquid crystal display (LCD) device has been most widely used due to the advantageous characteristics of thinness, lightness in weight, and low power consumption. In this way, the LCD device substitutes for the Cathode Ray Tube (CRT). In addition to the mobile type LCD devices such as displays for a notebook computers, LCD devices have been developed for computer monitors and televisions to receive and display broadcasting signals.

The general LCD device includes an LCD panel for displaying an image and a driver for applying a driving signal to the LCD panel. The LCD panel includes first and second glass substrates bonded together with a gap therebetween, and a liquid crystal layer injected between the first and second glass substrates.

The first glass substrate (TFT array substrate) includes a plurality of gate and data lines, a plurality of pixel electrodes and a plurality of thin film transistors. The plurality of gate lines are formed on the first glass substrate at fixed intervals in one direction, and the plurality of data lines are formed at fixed intervals substantially perpendicular to the plurality of gate lines. Then, a plurality of pixel electrodes in a matrix arrangement are formed in pixel regions defined by the plurality of gate and data lines crossing each other. The plurality of thin film transistors are switched according to signals on the gate lines for transmitting signals on the data lines to the respective pixel electrodes. The second glass substrate (color filter substrate) includes a black matrix layer preventing light from leaking into regions except the pixel regions of the first substrate, the R/G/B (red/green/blue) color filter layer displaying colors, and a common electrode displaying a picture image.

Next, a gap is maintained between the first and second glass substrates by spacers, and the first and second substrates are bonded to each other by a seal pattern having a liquid crystal injection inlet. At this time, the liquid crystal layer is formed using a liquid crystal injection method, in which the liquid crystal injection inlet is dipped into a container having liquid crystal while maintaining a vacuum state in the gap between the first and second glass substrates. That is, the liquid crystal is injected between the first and second substrates by an osmotic action. Then, the liquid crystal injection inlet is sealed with a sealant.

Meanwhile, the substrate for the LCD device is formed of a transparent glass substrate. The transparent glass substrate should be non-alkaline, heat-resistant and chemical-resistant. More particularly, the alkaline elements of the transparent glass substrate cause the thin film transistor to deteriorate. Therefore, it is necessary to completely remove the alkaline elements such as the sodium or potassium group materials in the transparent glass substrate. Also, the substrate is repetitively heated and cooled during a plurality of semiconductor process steps on the substrate. In this respect, it is important to obtain the heat-resistance characteristics in the substrate to stabilize the size of the substrate in case the glass substrate is heated or cooled. Also, a process for etching a metal or an oxide is required to form a driving device on the substrate for a display operation. The substrate has to obtain stabilization for an etchant of the metal or oxide.

In manufacturing devices using glass substrate, various kinds of glass substrates are used according to a manufacturing method as follows.

For example, a simple matrix type LCD device is manufactured at a low temperature of 300° C. or less, whereby lower and upper glass substrates of the said LCD device are formed of Soda Lime Glass of the inexpensive Low End Glass group. However, in case of an active matrix type LCD panel having a polysilicon type thin film transistor, a high temperature process of 300° C. or more is performed to lower and upper glass substrates. Thus, the lower and upper glass substrates are formed of Alumino-Silicate Glass having great resistance to heat damage or temperature changes and etching-resistance characteristics. The Alumino-Silicate Glass is three times as expensive as the Soda Lime Glass. That is, as the size of the LCD device increases, the cost of manufacturing material such as substrate is a burden.

The following table shows the remaining amount of sodium ions according to the kind of the glass substrate.

TABLE 1

| | Kind of Glass Substrate | |
| --- | --- | --- |
| Structure | Alumino-Silicate Glass | Soda Lime Glass |
| n+/SiNx/GLS (250° C.) | | |
| a-Si:H | $1.3 \times 10^{-3}$ | $1.9 \times 10^{-2}$ |
| SiNx | $2.1 \times 10^{-3}$ | $2.6 \times 10^{-2}$ |
| n+/SiNx/BCB/ GLS(250° C.) | | |
| a-Si:H | $5.5 \times 10^{-4}$ | $1.8 \times 10^{-3}$ |
| SiNx | $1.4 \times 10^{-3}$ | $3.0 \times 10^{-3}$ |
| BCB(Na/C) | $2.2 \times 10^{-3}$ | $6.7 \times 10^{-2}$ |
| ITO/GLS | | |
| ITO(Na/In) GLS | $8.5 \times 10^{-3}$ | $5.3 \times 10^{-2}$ |
| Glass n+/SiNx/GLS | $3.2 \times 10^{-1}$ | 3.6 |

TABLE 1-continued

|  | Kind of Glass Substrate | |
| --- | --- | --- |
| Structure | Alumino-Silicate Glass | Soda Lime Glass |
| (320° C.) | | |
| a-Si:H | $7.3 \times 10^{-4}$ | $1.3 \times 10^{-2}$ |
| SiNx | — | — |

As shown in Table 1, in the case of the Low End Glass such as the Soda Lime Glass, respective glass substrates contain a large amount of sodium as compared to those of the Alumino-Silicate Glass. Even though the temperature of heat treatment is changed in case of the Soda Lime Glass, the amount of sodium ions is scarcely decreased. In fact, the amount of mobile ions remaining on the semiconductor layer (a-Si:H, before hardening to a polysilicon) is the most serious problem because the semiconductor layer obtains TFT device characteristics.

Accordingly, the substrate may be formed of the Soda Lime Glass in a simple matrix type LCD device since it is possible to contain mobile ions in a buffer layer of silicon nitride layer SiNx formed on the glass substrate. However, in case of the active matrix type LCD panel having an amorphous silicon type thin film transistor requiring a high temperature process, it is impossible to use the buffer layer as a barrier layer because the great amount of mobile ions, so the Soda Lime Glass is not used as the substrate in the active type LCD panel.

Hereinafter, a method for manufacturing a thin film transistor array substrate of an LCD device according to the related art will be described with reference to the accompanying drawings.

FIG. 1 is a cross-sectional view illustrating a semiconductor layer on Low End Glass in an LCD device according to the related art. FIG. 2 is a cross-sectional view illustrating mobile ions of the Low End Glass penetrating to a semiconductor layer.

As shown in FIG. 1, in the LCD device according to the related art, a buffer layer 12 is formed on a glass substrate 11. The buffer layer 12 serves as a barrier layer. Then, a semiconductor layer 13 is formed in an island-shape on the buffer layer 12. The buffer layer 12 prevents mobile ions of the glass substrate 11 from penetrating into the semiconductor layer 13.

Although not shown, a gate insulating layer is deposited on the buffer layer 12 including the semiconductor layer 13, and a gate electrode is formed on a predetermined region thereof. Subsequently, an insulating interlayer is formed on an entire surface of the glass substrate 11, and source/drain electrodes are formed and connected to a impurity region of the semiconductor layer 13, thereby forming a thin film transistor. After that, a pixel electrode is formed and connected to the drain electrode, whereby the thin film transistor array substrate is completed.

However, as shown in FIG. 2, in case sodium ions Na+ flow into the glass substrate 11, the buffer layer 12 does not serve as the barrier layer preventing mobile ions from penetrating into the semiconductor layer 13. Especially with Low End Glass containing a large amount of mobile ions, the buffer layer 12 does not serve as the barrier layer for preventing penetration of mobile ions to the semiconductor layer 13. Thus, the gate threshold voltage is increased due to the mobile ions penetrating into the semiconductor layer 13.

The method for manufacturing the thin film transistor array substrate according to the related art has the following disadvantages. Recently, the thin film transistors are manufactured at a low temperature of 200° C. or less, so that it relaxes the requirements on heat damage or temperature changes. Accordingly, if the substrate satisfies requirements except the heat-resistance requirement, the Soda Lime Glass may be used as the substrate for the LCD device. It is preferable to use the Soda Lime Glass as the substrate because the Soda Lime Glass is inexpensive. Soda Lime Glass costs one-third as much as Alumino-Silicate Glass. So if it is possible to prevent the semiconductor layer from being contaminated by the mobile ions and impurities of the glass when using the substrate of the Soda Lime Glass, the manufacturing cost will be greatly reduced for the LCD device. However, the buffer layer, formed between the semiconductor layer and the substrate, does not serve as a barrier layer, whereby the mobile ions of the substrate may penetrate into the semiconductor layer. Thus, the gate threshold voltage is increased when forming the thin film transistor.

SUMMARY OF THE INVENTION

Accordingly, the present invention is directed to a thin film transistor array substrate and a method for manufacturing the same that substantially obviates one or more problems due to limitations and disadvantages of the related art.

An advantage of the present invention is to provide a thin film transistor array substrate and a method for manufacturing the same, in which it is possible to prevent mobile ions contained in a substrate from penetrating into a semiconductor layer by the gettering effect or neutralization when Low End Glass is used for the substrate.

Additional advantages and features of the invention will be set forth in part in the description which follows and in part will become apparent to those having ordinary skill in the art upon examination of the following or may be learned from practice of the invention. The advantages of the invention may be realized and attained by the structure particularly pointed out in the written description and claims hereof as well as the appended drawings.

To achieve these advantages and in accordance with the purpose of the invention, as embodied and broadly described herein, a method for manufacturing a thin film transistor array substrate includes forming a buffer layer on a substrate; doping impurity ions in the buffer layer; and forming a pixel electrode and a thin film transistor including a semiconductor layer on the buffer layer.

For example, when the substrate is Soda Lime Glass, the buffer layer is formed of at least one of a silicon oxide layer, a silicon nitride layer, a silicon oxide nitride layer and an organic insulating layer. The impurity ions may be phosphorous ions, and a phospho-silicate glass layer is formed on a surface of the buffer layer for gettering mobile ions penetrating the buffer layer from the outside by doping the phosphorus ions. Also, the impurity ions may be chlorine ions, and a reactive layer is formed in an interface between the buffer layer and the soda lime glass to neutralize mobile ions penetrating the buffer layer from the outside by doping the chlorine ions.

In another aspect of the present invention, a thin film transistor array substrate may include a glass substrate; a first buffer layer on the glass substrate; a barrier layer on the first buffer layer; a second buffer layer on the barrier layer; and a thin film transistor array on the second buffer layer, the thin film transistor array having at least a semiconductor layer, a thin film transistor and a pixel electrode. The barrier layer may be formed of a phospho-silicate glass layer, and the first and second buffer layers may be one of a silicon nitride layer, a silicon oxide layer, a silicon oxide nitride layer, and an organic insulating layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

A thin film transistor array substrate and a method for manufacturing the same will be described with reference to the accompanying drawings.

Figure 1:
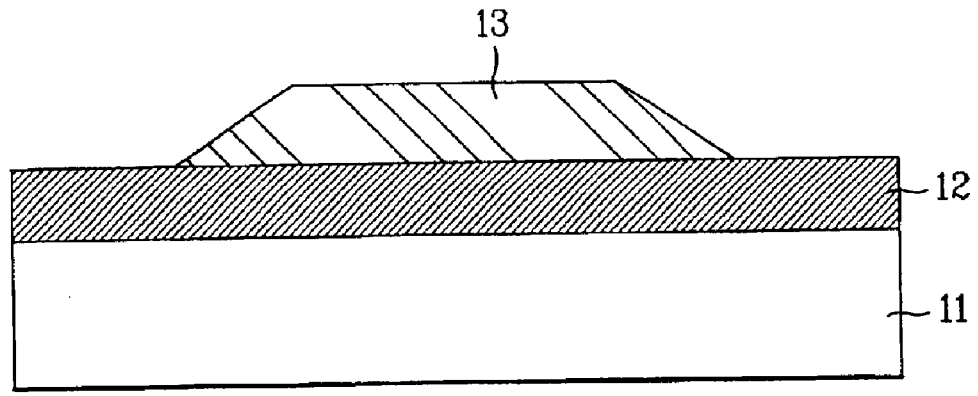
FIG. 1 is a cross-sectional view illustrating a semiconductor layer on Low End Glass in an LCD device according to the related art.
Figure 2:
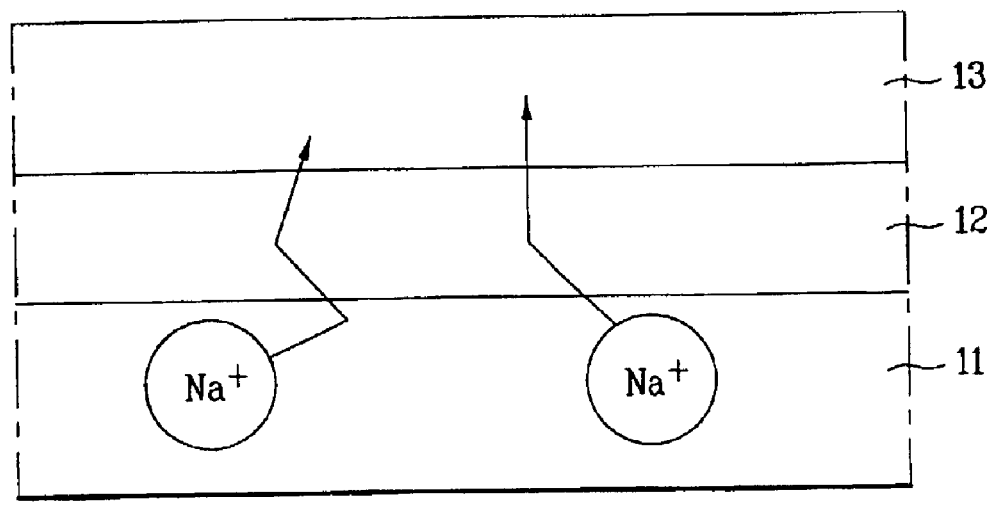
FIG. 2 is a cross-sectional view illustrating mobile ions of the Low End Glass penetrating into a semiconductor layer.
Figure 3A:
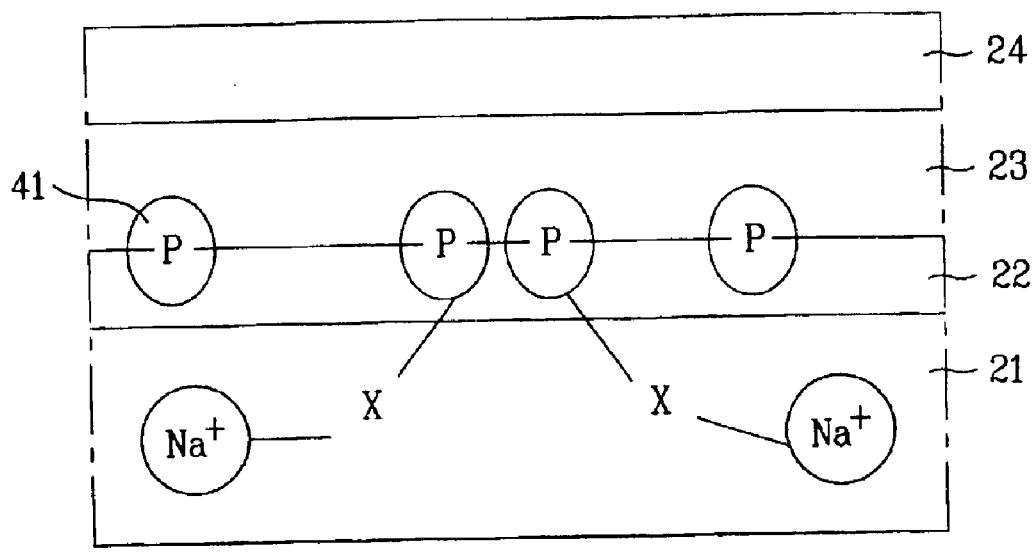
FIG. 3A is a cross-sectional view illustrating a method for manufacturing a thin film transistor array substrate according to the first embodiment of the present invention.

FIG. 3A is a cross-sectional view illustrating a method for manufacturing a thin film transistor array substrate according to the first embodiment of the present invention. The method for manufacturing the thin film transistor array substrate according to the first embodiment of the present invention may include the process steps of forming a first buffer layer 22 on a substrate 21 formed of Low End Glass, doping phosphorus ions 41 on the first buffer layer 22, and forming a second buffer layer 23 on the first buffer layer 22. Then, a pixel electrode (not shown) and a thin film transistor (not shown) including a semiconductor layer 24 may be formed on the second buffer layer 23, thereby completing the thin film transistor array substrate. The doping process of the phosphorus ions 41 also may be performed after forming the second buffer layer 23.

The Low End Glass may be formed of Soda Lime Glass. Also, a phospho-silicate glass layer may be formed at an interface between the first and second buffer layers 22 and 23 for gettering mobile ions by the doped phosphorus ions. Accordingly, the phospho-silicate glass layer serves as a barrier layer to prevent the mobile ions such as Na+ ions of the glass substrate from flowing into the semiconductor layer by the gettering effect. The mobile ions such as Na+ ions are dispersed in the substrate 21 and the first buffer layer 22.

The phospho-silicate glass layer may be formed on the surface of the first buffer layer 22 formed by the doping process of the phosphorous ions 41, which serves as the barrier layer to prevent the mobile ions from penetrating the semiconductor layer 24 during heat processing or the processing for forming the thin film transistor including the semiconductor layer 24. Also, the second buffer layer 23 is additionally may be formed on the first buffer layer in that the phospho-silicate glass layer is formed on the surface of the first buffer layer 22. When the semiconductor layer 24 is directly formed on the first buffer layer 22, the mobile ions, which are not reactive with the phosphorus ions, may easily flow into the semiconductor layer 24. At this time, the first and second buffer layers 22 and 23 may be formed of a silicon nitride layer SiNx, a silicon oxide layer, a silicon oxide nitride layer, or an organic insulating layer of BCB group.

Figure 3B:
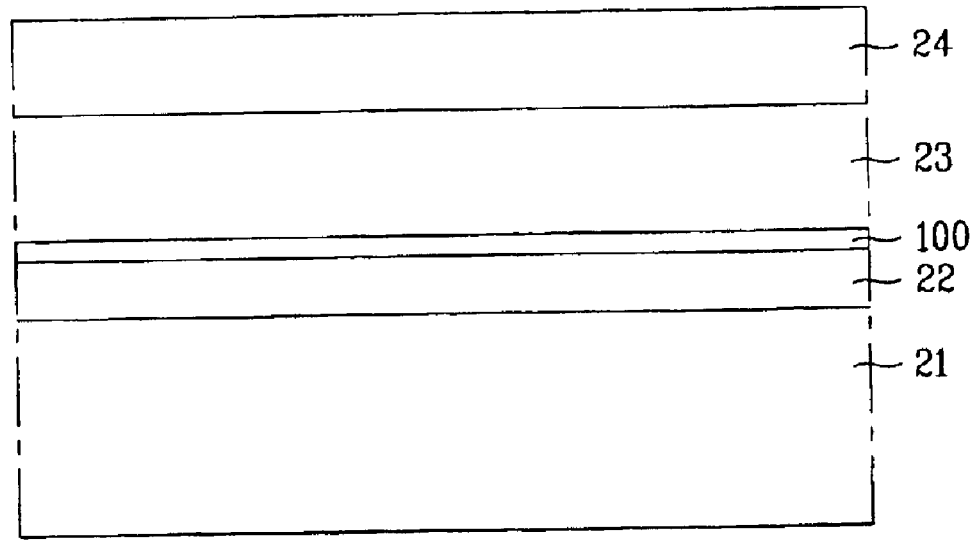
FIG. 3B is a cross-sectional view illustrating a thin film transistor array substrate according to the first embodiment of the present invention.

FIG. 3B is a cross-sectional view illustrating the thin film transistor array substrate according to the first embodiment of the present invention, which is manufactured by the aforementioned method. The thin film transistor array substrate according to the first embodiment of the present invention may include the Low End Glass substrate 21, the first buffer layer 22 on the Low End Glass substrate 21, the phospho-silicate glass substrate 100 as the barrier layer on the first buffer layer, the second buffer layer 23 on the phospho-silicate glass layer 100, the semiconductor layer 24 on the second buffer layer 23, and a thin film transistor array (not shown) including the thin film transistor and the pixel electrode.

Figure 4A:
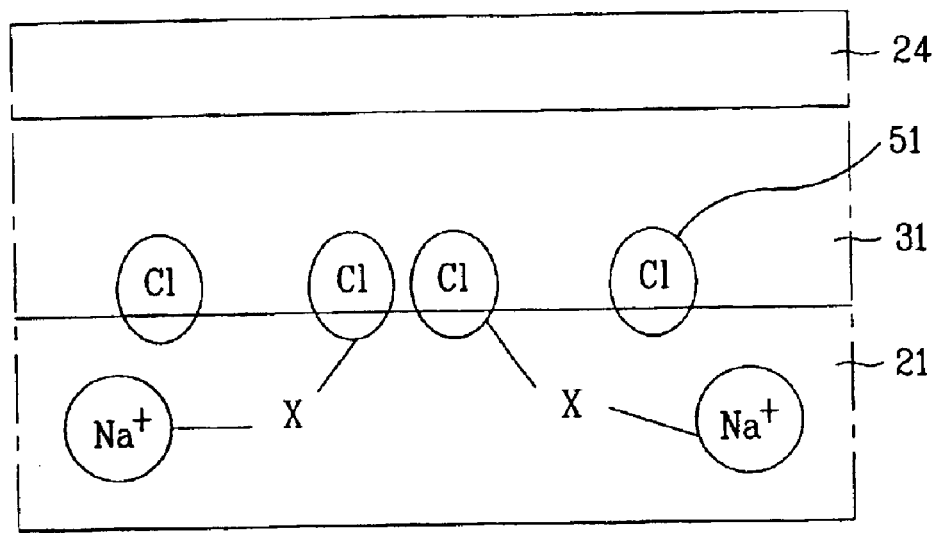
FIG. 4A is a cross-sectional view illustrating a method for manufacturing a thin film transistor array substrate according to the second embodiment of the present invention.

FIG. 4A is a cross-sectional view illustrating a method for manufacturing a thin film transistor array substrate according to the second embodiment of the present invention. The method for manufacturing the thin film transistor array substrate according to the second embodiment of the present invention may include the process steps of forming a buffer layer 31 on a substrate 21 formed of Low End Glass, doping chlorine ions 51 into the buffer layer 31, and forming a pixel electrode (not shown) and a thin film transistor (not shown) containing a semiconductor layer 24 on the buffer layer 31. The Low End Glass may be formed of Soda Lime Glass, and a reactive layer may be formed in an interface between the substrate 21 and the buffer layer 31 by the doped chlorine ions, whereby mobile ions contained in the substrate 21 are neutralized in the reactive layer. Accordingly, the reactive layer may be formed on the interface of the substrate 21 by doping chlorine ions, whereby the reactive layer serves as a barrier layer to prevent the mobile ions from penetrating into the semiconductor layer 24. As a result, it is possible to prevent the device characteristics from deteriorating. The buffer layer 31 may be formed of a silicon nitride layer SiNx, a silicon oxide layer, a silicon oxide nitride layer or an organic insulating layer of BCB group.

The method for manufacturing the thin film transistor array substrate using the chlorine ion injection method according to the second embodiment of the present invention is different from that according to the first embodiment of the present invention in that the reactive layer is formed on the surface of the substrate 21. As a result, it is not necessary to additionally form the buffer layer to prevent the mobile ions from penetrating into the semiconductor layer.

Figure 4B:
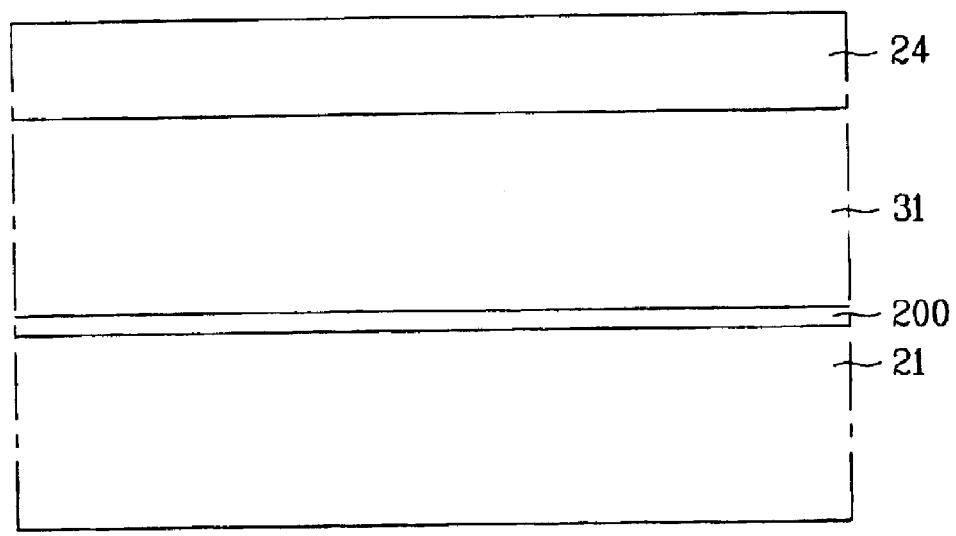
FIG. 4B is a cross-sectional view illustrating a thin film transistor array substrate according to the second embodiment of the present invention.

FIG. 4B is a cross-sectional view illustrating the thin film transistor array substrate according to the second embodiment of the present invention, which is manufactured by the aforementioned method of FIG. 4A. As shown in FIG. 4B, the thin film transistor array substrate according to the second embodiment of the present invention may include the Low End Glass substrate 21, the buffer layer 31 on the Low End Glass substrate 21, the ion reactive layer 200 at the interface between the Low End Glass substrate 21 and the buffer layer 31, the semiconductor layer 24 on the buffer layer 31, and a thin film transistor array including the thin film transistor and pixel electrode (not shown).

As mentioned above, the ion reactive layer 200 may be formed by a reaction of chlorine ions and the buffer layer 31, and the buffer layer 31 may be formed of a silicon oxide layer, a silicon nitride layer, a silicon oxide nitride layer or an organic insulating layer.

Figure 5:
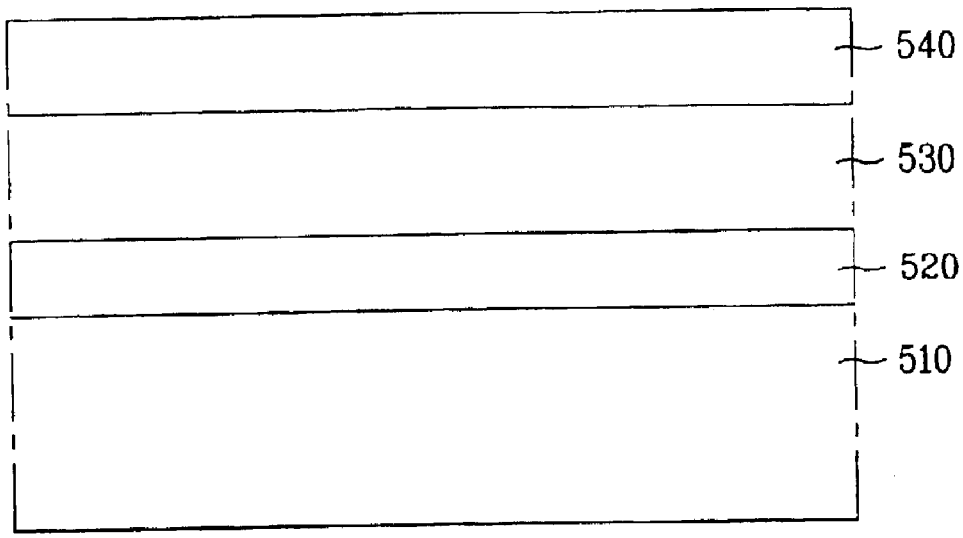
FIG. 5 is a cross-sectional view schematically illustrating a method for manufacturing a thin film transistor array substrate according to the third embodiment of the present invention.

FIG. 5 is a cross-sectional view schematically illustrating a method for manufacturing a thin film transistor array substrate according to the third embodiment of the present invention. The method for manufacturing the thin film transistor array substrate may include the process steps of forming a first buffer layer 520 on a substrate 510 formed of Low End Glass, forming a second buffer layer 530 on the first buffer layer 520, doping an impurity such as phosphorus or chlorine ions on the second buffer layer 530, and forming a pixel electrode (not shown) and a thin film transistor (not shown) having a semiconductor layer 540 on the second buffer layer 530.

As mentioned above, in the case of doping the phosphorus or chlorine ions after forming the first and second buffer layers 520 and 530, the phosphorous or chlorine ions may distribute throughout the first and second buffer layers 520 and 530 with a Gaussian profile. Accordingly, if the impurity doping process is performed such that the peak of Gaussian profile is positioned at the interface between the first and second buffer layers 520 and 530, an impurity layer (not shown) of the phosphorous or chlorine ions may be formed in the interface between the first and second buffer layers 520 and 530. The impurity layer prevents mobile ions such as Na or K from moving.

The first and second buffer layers 520 and 530 may be formed of the same material as those of the substrate and buffer layer in the first and second embodiments of the present invention. In the method for manufacturing the thin film transistor array substrate according to the third embodiment of the present invention, the first and second buffer layers 520 and 530 are formed of a silicon oxide layer. In case of doping the phosphorous ions, the impurity layer is formed of phospho-silicate glass between the first and second buffer layers 520 and 530 since an amorphous combination of P—Si—O is the same as a glass structure.

Figure 6:
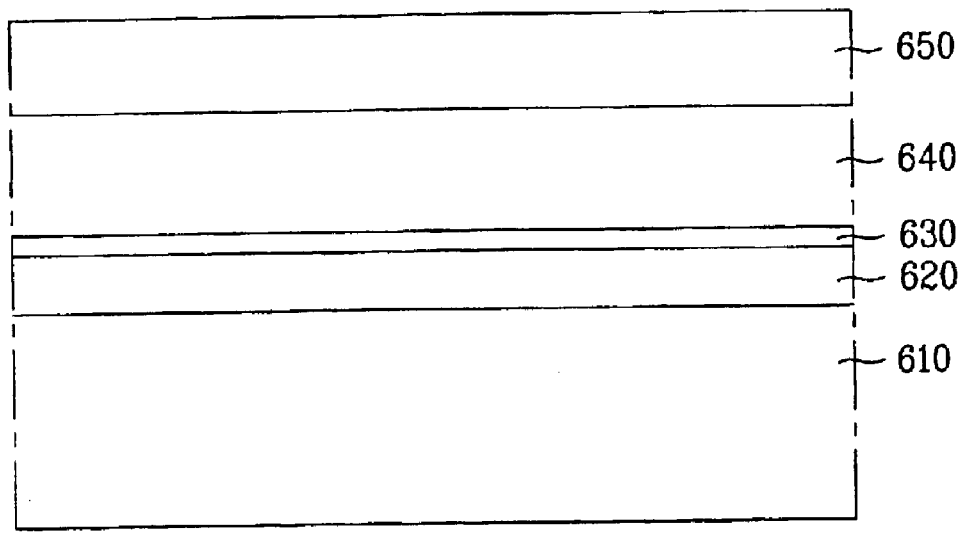
FIG. 6 is a cross-sectional view schematically illustrating a method for manufacturing a thin film transistor array substrate according to the fourth embodiment of the present invention.

FIG. 6 is a cross-sectional view schematically illustrating a method for manufacturing a thin film transistor array substrate according to the fourth embodiment of the present invention. The method for manufacturing the thin film transistor array substrate includes the process steps of forming a first buffer layer 620 on a substrate 610 formed of Low End Glass, forming an reactive layer 630 on an upper surface of the first buffer layer 620 for preventing mobile ions such as Na and K from moving by performing a plasma treatment using a plasma gas such as phosphorous or chlorine on the upper surface of the first buffer layer 620, forming a second buffer layer 640 on the reactive layer 630, and forming a pixel electrode (not shown) and a thin film transistor (not shown) having a semiconductor layer 650 on the second buffer layer 640.

When performing the plasma treatment in the upper surface of the first buffer layer 620, the plasma gas including the phosphorous or chlorine penetrates into the first buffer layer 620 at 50 Å or less. In the method of manufacturing the thin film transistor array substrate according to the fourth embodiment of the present invention, the first and second buffer layers 620 and 640 may be formed of the same material as those of the substrate and buffer layer in the first, second and third embodiments of the present invention.

Figure 7:
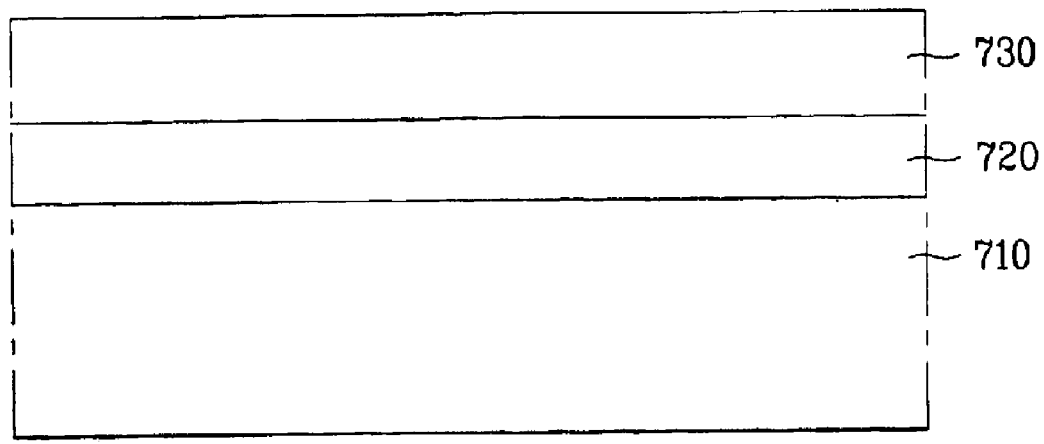
FIG. 7 is a cross-sectional view schematically illustrating a method for manufacturing a thin film transistor array substrate according to the fifth embodiment of the present invention.

FIG. 7 is a cross-sectional view schematically illustrating a method for manufacturing a thin film transistor array substrate according to the fifth embodiment of the present invention. The method for manufacturing the thin film transistor array substrate may include the process steps of forming a buffer layer 720 on a substrate 710 formed of Low End Glass, doping an impurity such as phosphorous or chlorine ions on the buffer layer 720, and forming a pixel electrode (not shown) and a thin film transistor (not shown) having a semiconductor layer 730 on the buffer layer 720.

As mentioned above, in case of doping the phosphorous or chlorine ions after forming the buffer layer 720 on the substrate 710, the phosphorous or chlorine ions may distribute throughout the substrate 710 and the buffer layer 720 in a Gaussian profile. Accordingly, if the impurity doping process is performed such that the peak of Gaussian profile is positioned in an interface between the substrate 710 and the buffer layer 720, an impurity layer (not shown) of the phosphorous or chlorine ions may be formed at the interface between the substrate 710 and the buffer layer 720. The impurity layer prevents mobile ions such as Na and K from moving. The substrate 710 and the buffer layer 720 may be formed of the same material as those of the substrate and the buffer layer in the first, second, third and fourth embodiments of the present invention.

Hereinafter, a method for manufacturing a thin film transistor array substrate including the thin film transistor with the aforementioned Low End Glass substrate, according to the present invention will be described as follows.

Figure 8:
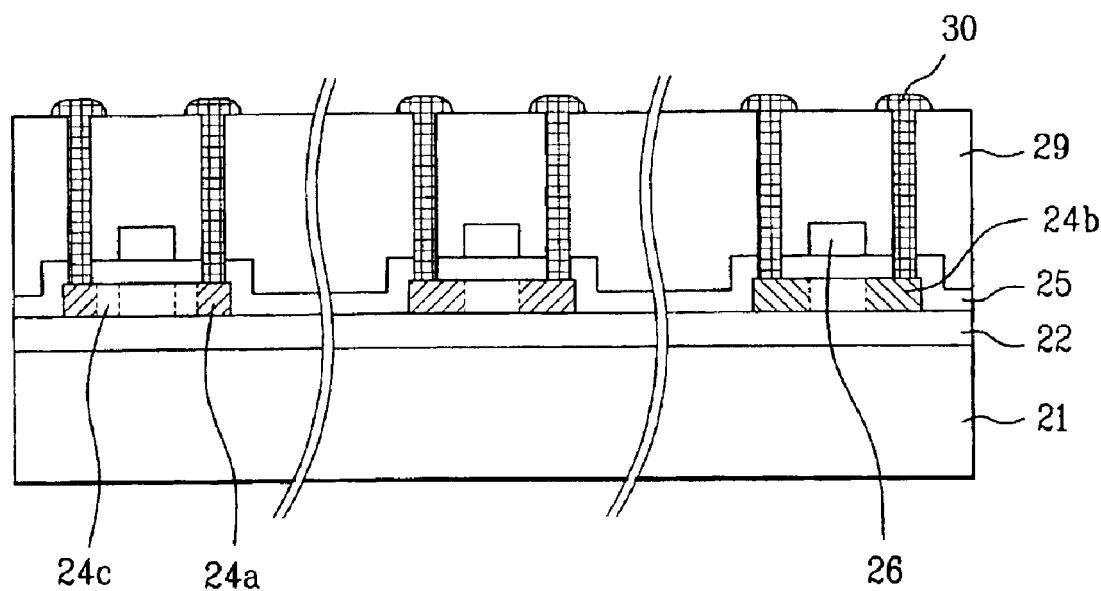
FIG. 8 is a cross-sectional view illustrating a top gate type thin film transistor on Low End Glass to which a mobile ion treatment is performed according to one embodiment among the first to fifth embodiments of the present invention.

FIG. 8 is a cross-sectional view illustrating a top gate type thin film transistor on Low End Glass to which mobile ions treatment is performed according to one embodiment among the first to fifth embodiments of the present invention. A buffer layer 22 is deposited on a substrate 21. After doping phosphorous or chlorine ions 41 or 51 in the buffer layer 22, an amorphous silicon a-Si:H is deposited on the buffer layer 22. When doping the phosphorous ions, a second buffer layer (not shown) may be additionally formed on the buffer layer 22. After that, the deposited amorphous silicon a-Si:H may be dehydrogenated and then crystallized into a polysilicon by laser. Then, the polysilicon is patterned, thereby forming a semiconductor layer 24 as an active layer of each thin film transistor (TFT). Subsequently, a gate insulating layer 25 is deposited on the entire surface of the semiconductor layer 24, and a metal layer is deposited on the gate insulating layer 25. Then, the metal layer is selectively removed, whereby a gate electrode 26 of the TFT is formed above a predetermined portion of the semiconductor layer 24.

Next, a first photoresist layer is deposited on the entire surface of the substrate, and a mask (not shown) is formed for highly doped n-type (n+) impurity ions injection by exposure and developing process. Then, the highly doped n-type impurity ions are injected through the mask, thereby forming highly doped n-type impurity regions 24a on the semiconductor layer 24 corresponding to n-type TFT region and lightly doped drain (LDD) n-type TFT region. That is, a first mask (not shown) is formed on p-type TFT region for covering an entire surface of the p-type TFT region, and a second mask (not shown) is formed on the LDD n-type TFT region, the second mask (not shown) is wider than the gate electrode 26. The second mask is formed on the gate insulating layer 25 to have a width suitable for covering the gate electrode 26 and LDD region formed in the following process. Also, the gate electrode 26 serves as the mask in the n-type TFT region, and the highly doped n-type impurity regions 24a are formed in the semiconductor layer 24 at both sides of the gate electrode 26. Generally, the n-type ion material is PH3.

Subsequently, the first and second masks are removed. A second photoresist layer is deposited, and then an exposure and developing process is performed thereon, so that a third mask (not shown) is formed for highly doped p-type (p+) impurity ion injection. Then, the highly doped p-type impurity ions are injected through the third mask, whereby highly doped p-type impurity regions 24b are formed on the semiconductor layer 24 corresponding to p-type TFT region. The third mask (not shown) covers the entire surface of the n-type TFT region and LDD n-type TFT region, and then the highly doped p-type impurity ions injection process is performed in the p-type TFT region by using the gate electrode 26 as the mask. Generally, the p-type ion material is B2H6.

Next, the third mask is removed, and then lightly doped n-type (n−) impurity ions are injected by using the gate electrode 26 of the TFT region as the mask. At this time, lightly doped n-type impurity regions 24c are formed in the semiconductor layer 24 corresponding to both sides of the gate electrode 26 of the LDD n-type TFT region. In this case, the lightly doped n-type impurity ions injection process does not have a great effect on the impurity intensity of the highly doped impurity regions such as the n-type TFT region and p-type TFT region since the n-type or p-type TFT region is formed through the highly doped impurity ions injection process, the preceding process. Also, it is possible to change the order of the lightly doped ions injection process and the highly doped ions injection process. The lightly doped ions injection process uses the gate electrode as the mask, and the highly doped ions injection process uses a mask for covering the LDD region.

After doping, an insulating interlayer 29 is formed on the entire surface of the substrate, and then the insulating interlayer 29 and the gate insulating layer 25 are selectively removed to form contact regions being contacted with the highly doped impurity regions 24a and 24b of the semiconductor layer 24. Subsequently, a metal layer is deposited on the entire surface of the insulating interlayer 29 including the contact regions, and then source and drain electrodes 30 are formed by patterning the metal layer. Although not shown, a passivation layer (not shown) may be formed on the entire surface of the substrate 21 including the source and drain electrodes 30, and a pixel electrode (not shown) may formed on a predetermined portion of the passivation layer for being connected to the drain electrode 30.

In addition to the top gate type thin film transistor for forming the semiconductor layer on the buffer layer, a bottom gate type thin film transistor is proposed to prevent alkaline ions from the glass substrate from penetrating into the device. In the bottom type thin film transistor for forming a semiconductor layer above a gate electrode, chlorine or phosphorous ions are doped on a buffer layer for preventing the alkaline ions from penetrating into the inside of the device.

Hereinafter, a method for forming the bottom type thin film transistor will be described. In the method for forming the bottom type thin film transistor, mobile ion treatment is performed on the buffer layer.

Figure 9:
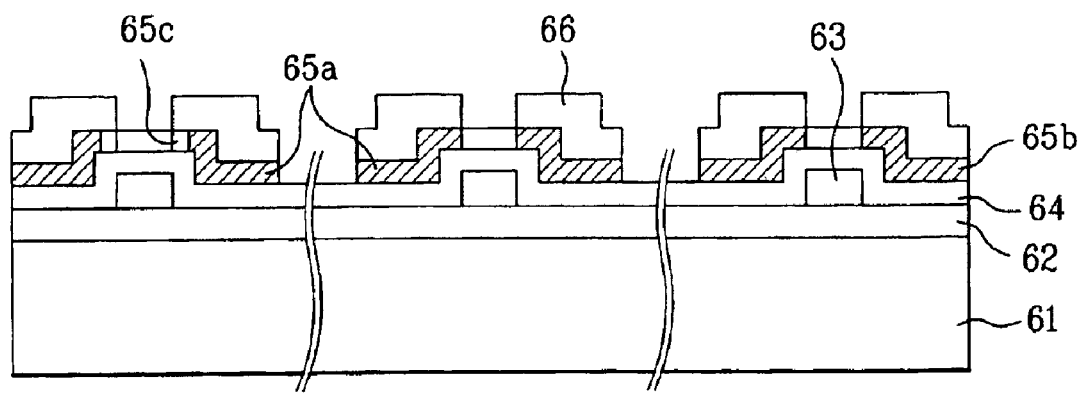
FIG. 9 is a cross-sectional view illustrating a bottom gate type thin film transistor on Low End Glass to which mobile ions treatment is performed according to one embodiment among the first to fifth embodiments of the present invention.

FIG. 9 is a cross-sectional view illustrating the bottom gate type thin film transistor on Low End Glass to which a mobile ion treatment is performed according to one embodiment among the first to fifth embodiments of the present invention. A buffer layer 62 is deposited on a substrate 61. Then, phosphorus 41 or chlorine 51 ions are doped on the buffer layer 62 for gettering alkaline ions such as sodium ions in the buffer layer or interface between the substrate 61 and the buffer layer 62. Then, a metal layer is deposited on the entire surface of the buffer layer 62, and then selectively removed to form gate electrodes 63 of respective TFTs. A gate insulating layer 64 is deposited on the entire surface of the buffer layer 62 including the gate electrodes 63. Subsequently, a semiconductor layer 65 is formed on the gate insulating layer 64. The semiconductor layer 65 may be formed by depositing amorphous silicon a-Si:H, dehydrogenating the deposited amorphous silicon (a-Si:H), and crystallizating the dehydrogenated amorphous silicon. In this case, the crystallization process may be performed before or after patterning the semiconductor layer 65.

As mentioned above, impurity ions are injected to the semiconductor layer 65 corresponding to the respective TFT regions, thereby forming impurity regions 65a, 65b and 65c. After that, a metal layer is deposited on the entire surface of the semiconductor layer 65, and then selectively removed to form source/drain electrodes 66. Like FIG. 8, although not shown, a passivation layer (not shown) may be formed on the entire surface of the substrate 61 including the source/drain electrodes 66, and then a pixel electrode (not shown) may be formed on a predetermined portion of the passivation layer for being connected to the drain electrode 66.

As mentioned above, the thin film transistor array substrate and the method for manufacturing the same according to the present invention has the following advantages. First, the substrate is formed of cheap Low End Glass, thereby decreasing manufacturing cost. Also, the phosphorous or chlorine ions are doped on the buffer layer, so that it is possible to prevent the mobile ions from penetrating into the semiconductor layer by the gettering effect or neutralization of the reactive layer, thereby forming the thin film transistor and obtaining stable device characteristics.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A thin film transistor array substrate comprising:
   a glass substrate;
   a buffer layer on the glass substrate;
   a reactive layer between a surface of the glass substrate and an outer surface of the buffer layer, and
   a thin film transistor array on the buffer layer, the thin film transistor array having at least a semiconductor layer, a thin film transistor and a pixel electrode.

2. The thin film transistor array substrate of claim 1, wherein the reactive layer is formed by a reaction of one of chlorine and phosphors and the buffer layer.

3. The thin film transistor array substrate of claim 1, wherein the buffer layer is one of a silicon nitride layer, a silicon oxide layer, a silicon oxide nitride layer, and an organic insulating layer.

4. The thin film transistor array substrate of claim 1, wherein the substrate is a soda lime glass substrate.

5. The thin film transistor array substrate of claim 1, wherein the reactive layer is a phospho-silicate glass layer is formed on a surface of the buffer layer for gettering mobile ions penetrating the buffer layer by the placing phosphorus ions in the buffer layer.

6. The thin film transistor array substrate of claim 1, wherein the reactive layer is formed by placing impurity ions in the buffer layer forming a Gaussian profile of impurity ions.

7. The thin film transistor array substrate of claim 6, wherein the peak of the Gaussian profile of impurity ions is positioned at an interface between the glass substrate and the buffer layer.

8. A thin film transistor may substrate comprising:
   a glass substrate;
   a first buffer layer on the glass substrate;
   a second buffer layer on the first buffer layer;
   a reactive layer between a surface of the glass substrate and an outer surface of the second buffer layer; and
   a thin film transistor array on the second buffer layer, the thin film transistor array having at least a semiconductor layer, a thin film transistor and a pixel electrode.

9. The thin film transistor array substrate of claim 8, wherein the reactive layer is formed of a phospho-silicate glass layer.

10. The thin film transistor array substrate of claim 8, wherein the first and second buffer layers are one of a silicon nitride layer, a silicon oxide layer, a silicon oxide nitride layer, and an organic insulating layer.

11. The thin film transistor array substrate of claim 8, wherein the reactive layer is formed by one of the following implantation, plasma treatment, doping, ion showering, diffusion, chemical vapor deposition, sputtering, and dry etching.

12. The thin film transistor array substrate of claim 8, wherein the reactive layer is formed by placing impurity ions in the first buffer layer.

13. The thin film transistor array substrate of claim 8, wherein the reactive layer is formed by placing impurity ions in the second buffer layer.

14. The thin film transistor array substrate of claim 8, the substrate is a soda lime glass substrate.

15. The thin film transistor array substrate of claim 8, wherein reactive layer is formed by placing impurity ions in a Gaussian profile of impurity ions.

16. The thin film transistor array substrate of claim 15, wherein the peak of the Gaussian profile of impurity ions is positioned at an interface between the first and second buffer layers.

17. The thin film transistor array substrate of claim 15, wherein the peak of the Gaussian profile of impurity ions is positioned at an interface between the first buffer layer and the glass substrate.

18. The thin film transistor array substrate of claim 8, wherein the reactive layer is a phospho-silicate glass layer formed by doping phosphorous ions for gettering mobile ions penetrating from the glass substrate at an interface between the first buffer layer and second buffer layer.

* * * * *